Jan. 21, 1969 TOSHIO KUROSAWA ET AL 3,423,647

SEMICONDUCTOR DEVICE HAVING REGIONS WITH PRESELECTED DIFFERENT MINORITY CARRIER LIFETIMES

Filed July 28, 1965

INVENTORS.
TOSHIO KUROSAWA
HIROSHI SHIBA

BY Hopgood & Calimafde

ATTORNEYS.

United States Patent Office 3,423,647

Patented Jan. 21, 1969

3,423,647

SEMICONDUCTOR DEVICE HAVING REGIONS WITH PRESELECTED DIFFERENT MINORITY CARRIER LIFETIMES

Toshio Kurosawa and Hiroshi Shiba, Tokyo, Japan, assignors to Nippon Electric Company Limited, Minato-ku, Tokyo, Japan, a corporation of Japan Filed July 28, 1965, Ser. No. 475,433

Claims priority, application Japan, July 30, 1964, 39/43,602

U.S. Cl. 317—234 9 Claims

Int. Cl. H01l 3/00, 5/00

ABSTRACT OF THE DISCLOSURE

A semiconductor device having regions with different minority carrier lifetimes formed by introducing gold into at least one preselected region of a semiconductor wafer to alter the minoritiy carrier lifetimes of those regions into which the gold is introduced.

This invention relates to semiconductor devices and to a method of manufacturing the same, and more particularly to such devices which are provided with regions having appreciably different carrier lifetimes within the same semiconductor body.

It is well known to those skilled in the art that introduction of a carrier lifetime reducing agent or killer in a semiconductor body is effective in reducing the charge storage time of impurity diffused transistors and diodes. Since the quantity of the lifetime reducing agent introduced is uniform over the wafer surface in conventionally known methods of manufacture, the lifetime of the same type minority carrier is the same over the entire wafer surface. It has been impossible, therefore, to construct transistors or diodes having different minority carrier storage times on the same wafer at the same time.

Accordingly, it is an object of the present invention to provide a semiconductor and manufacturing method therefor, whereby a minority carrier lifetime reducing agent is selectively introduced into desired portions of the semiconductor surface.

The invention, together with the various features and advantages thereof, will be clearly understood when reference is made to the specification and claims, together with the drawing in which:

Figure 1:
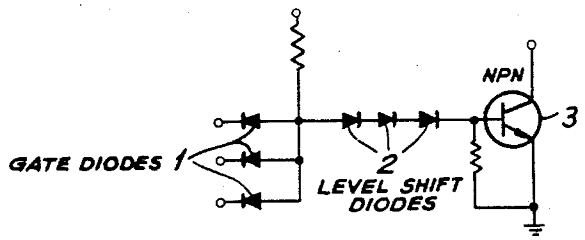
FIG. 1 is a conventional low level logic circuit diagram.

In integrated circuits, transistors and diodes having different carrier storage times are sometimes required on the same wafer. For example, a low level logic circuit as shown in FIG. 1 requires a short carrier storage time for the gate diodes 1 and for the inverter transistor 3, and a long carrier storage time for the level shift diodes 2 in order to reduce the average propagation delay time of the circuit.

The lifetime of the same type carrier is uniformly reduced over the semiconductor wafer surface by the conventional manufacturing method, and hence the carrier storage time of the level shift diodes 2 is reduced when those of the gate diodes 1 and the inverter transistor 3 are reduced. Consequently, it has been impossible heretofore to shorten the average propagation delay time of the low level logic circuit.

Thus, it is another object of this invention to provide a low level logic integrated semiconductor circuit with a significantly shortened average propagation delay time, and a method for making the same.

Figure 2:
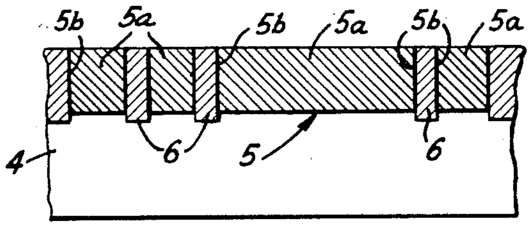
FIG. 2 is a cross-sectional view of a semiconductor integrated circuit wafer according to the invention, immediately after isolation diffusion therein.

Reference is now made to FIG. 2, which illustrates a low level logic circuit. In this figure, a p-type silicon wafer 4 has an n-type silicon single crystal layer 5 epitaxially grown thereon, wherein boron is diffused into regions 6 to penetrate through the epitaxial layer 5, thereby isolating portions of the n-type epitaxial layer 5 into regions 5*a*, by means of p–n junctions 5*b*.

Figure 3:
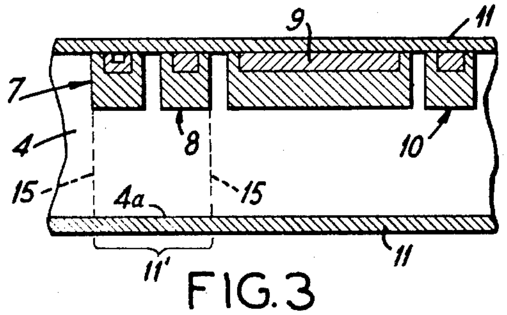
FIG. 3 shows the wafer of FIG. 2 in cross-section with an oxide film thereon.

In FIG. 3, an NPN type transistor 7, gate diode 8, resistor 9 and level shift diode 10 are formed within the isolated n-type epitaxial layer regions 5*a* in accordance with the well known technique of manufacturing planar transistors. The silicon wafer having the transistor, diodes and resistor thus formed is then covered with a barrier in the form of silicon oxide films 11 on both the top and bottom surfaces thereof. The portion 11' of this silicon oxide film between the dashed lines 15 is then removed, leaving the surface portion 4*a* of the wafer between these lines exposed.

Figure 4:
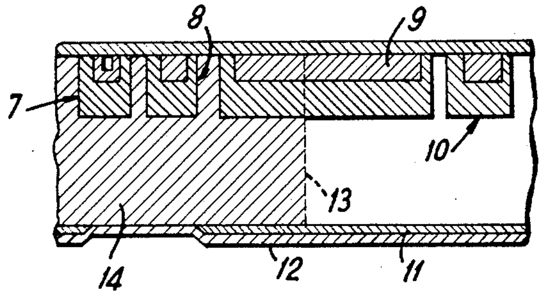
FIG. 4 shows the wafer in cross-section with a layer of gold deposited on the bottom surface.

The lifetime reducing agent or killer is to be introduced through the exposed surface portion 4*a* into the portion of the wafer containing the NPN transistor 7 and gate diode 8. The lifetime reducing agent may preferably take the form of gold 12, deposited by vacuum evaporation techniques on the entire bottom surface of the wafer 4, as shown in FIG. 4, and diffused at a wafer temperature of approximately 1000° C. for a preselected period of time such as, for example, 10 minutes. At this temperature the gold 12 and silicon oxide film 11 do not react, and furthermore, gold does not diffuse into the wafer through the silicon oxide film. Therefore, gold diffusion takes place only through the exposed surface portion 4*a* where the silicon oxide film 11' has been removed. Since gold diffuses isotropically in silicon, only the region 14 on the left side in FIG. 4, containing the transistor 7 and gate diode 8, is influenced by the gold diffusion. Consequently, it is necessary to space the level shift diode 10 at a distance of at least the thickness of the wafer from the transistor 7 and the gate diode 8 in order to protect the level shift diode 10 from the effect of the gold.

After the selective gold diffusion step, portions of the silicon oxide film on the top wafer surface are removed to make openings for ohmic contacts to the transistor 7, diodes 8 and 10 and resistor 9. Aluminum contact material is then deposited, preferably by vacuum evaporation, on the entire wafer surface, and the portions of the aluminum not needed are then removed. The wafer is maintained at approximately 550° C. for 30 minutes and ohmic contacts are formed between the deposited aluminum and the elements at the openings where the silicon oxide film has been removed.

Thus, a semiconductor integrated circuit equivalent to the circuit shown in FIG. 1 is completed having gate and level shift diodes, a converter transistor and resistors isolated from one another with p-n junctions, all formed in a silicon wafer, the necessary electrical connections being made by aluminum conductors deposited on the silicon oxide film formed on the wafer surface.

A low level logic circuit made in accordance with the method described above has an average propagation delay time of approximately $10–20 \times 10^{-9}$ seconds, which is one-third or less of that obtainable by the conventional method of introducing the minority carrier lifetime reducing agent.

Although a specific embodiment of integrating a low level logic circuit is disclosed herein, the method in accordance with the present invention is effective for the manufacture of various types of semiconductor devices requiring regions with different minority carrier lifetimes in the same wafer. Therefore, it will be understood that the embodiment described is for illustrative purposes only and is not to be interpreted as any limitation on the scope of the present invention. Accordingly, various other semiconductor materials and carrier lifetime reducing agents may be employed and variations in the specific steps described may also be employed. Still other variations apparent to one skilled in the art may be employed without departing from the spirit or scope of the invention.

What is claimed is:

1. An integrated semiconductor device comprising:
a semiconductor wafer,
a first semiconductor region including an active circuit element adjacent one surface of said wafer,
a second semiconductor region also adjacent said one surface and containing a second active circuit element, said second region being isolated from said first region by an additional region of semiconductor material,
a diffusion zone containing a minority carrier lifetime reducing agent,
said first region being substantially within said diffusion zone, whereby the minority carrier lifetime of said latter region and said circuit element is changed by the presence of said agent,
and said second region being isolated from said diffusion zone so as to be unaffected by the presence of said agent.

2. The invention described in claim 1, wherein said device comprises a semiconductor wafer having an epitaxial layer with said regions formed therein,
and wherein said second region is spaced from said first region by a distance approximately equal to the thickness of said wafer.

3. The invention described in claim 1, wherein said reducing agent comprises gold.

4. An integrated semiconductor device comprising:
a semiconductor wafer having an epitaxial layer thereon,
a first semiconductor element including a first p-n junction in said layer,
a second semiconductor element including a second p-n junction, said second element also being in said epitaxial layer and being isolated from said first element by an isolation region that extends from the surface of said layer down into said wafer,
a barrier layer on a surface of said wafer opposite said epitaxial layer,
an aperture in said barrier layer,
a diffusion zone having a width substantially coextensive with the width of said aperture and containing a carrier lifetime reducing agent,
said first element being substantially wtihin said diffusion zone, whereby the carrier lifetime of said latter element is modified by the presence of said agent,
and said second element being spaced from said zone by a distance approximately equal to the thickness of said wafer.

5. An integrated semiconductor logic circuit comprising:
a wafer having a plurality of discrete regions isolated from one another therein,
different ones of said regions forming diode, transistor and resistor elements,
means interconnecting said elements to form said logic circuit,
a diffusion zone containing a minority carrier lifetime reducing agent, at least one of said regions being substantially within said diffusion zone whereby the minority carrier lifetime thereof is significantly modified by the presence of said agent,
and the remaining of said regions being isolated from said diffusion zone in order to be unaffected by the presence of said agent, whereby said circuit has average propagation delay time of approximately $10–20 \times 10^{-9}$ seconds.

6. The method of manufacturing a semiconductor device comprising the steps of:
disposing on the same surface first elements having a short minority carrier lifetime away from second elements having a long minority carrier lifetime at a distance at least longer than the thickness of the wafer having said first and second elements therein,
and introducing a lifetime reducing agent into said wafer only through portions of a second surface of said wafer, said portions being opposite to said first elements, so that said lifetime reducing agent causes no influence on said second elements disposed away from said first elements.

7. The method of manufacturing a semiconductor device comprising the steps of:
forming first and second discrete regions each containing at least an active circuit element adjacent a surface of a semiconductor wafer,
heating said wafer to an elevated temperature,
introducing a minority carrier lifetime reducing agent into said wafer while maintaining said temperature to form a diffusion zone in said wafer in the area of one of said regions and remote from the other of said regions, whereby the minority carrier lifetime of said one region is changed by the presence of said agent.

8. The method of manufacturing a semiconductor device comprising the steps of:
forming a plurality of discrete semiconductor elements in a semiconductor wafer in isolated relationship to one another,
forming a barrier layer on a surface of said wafer,
providing an aperture in said barrier layer,
and forming a diffusion zone in said wafer in the region of one of said elements by introducing a carrier lifetime reducing agent through said aperture while maintaining said wafer at an elevated temperature, whereby the carrier lifetime of said one element is changed by said agent while the carrier lifetime of the remaining elements is unaffected thereby.

9. The invention described in claim 8, wherein said reducing agent comprises gold and wherein said elevated temperature is approximately 1000° C.

References Cited

UNITED STATES PATENTS

| | | | |
|---|---|---|---|
| 2,976,426 | 3/1961 | Rappaport | 307—88.5 |
| 3,056,100 | 9/1962 | Warner | 338—25 |
| 3,067,485 | 12/1962 | Ciccolella et al. | 29—25.3 |
| 3,150,299 | 9/1964 | Noyce | 317—235 |
| 3,184,347 | 5/1965 | Hoerni | 148—33 |

JOHN W. HUCKERT, *Primary Examiner.*

R. F. SANDLER, *Assistant Examiner.*

U.S. Cl. X.R.

29—569; 148—187; 317—235